United States Patent [19]

Kurokawa

[11] Patent Number: 5,455,457
[45] Date of Patent: Oct. 3, 1995

[54] PACKAGE FOR SEMICONDUCTOR ELEMENTS HAVING THERMAL DISSIPATION MEANS

[75] Inventor: Yasuhiro Kurokawa, Tokyo, Japan

[73] Assignee: Nec Corporation, Tokyo, Japan

[21] Appl. No.: 596

[22] Filed: Jan. 5, 1993

Related U.S. Application Data

[63] Continuation of Ser. No. 795,875, Nov. 20, 1991, abandoned.

[30] Foreign Application Priority Data

Nov. 27, 1990 [JP] Japan ................... 2-324796

[51] Int. Cl.⁶ .................... H01L 23/02; H01L 23/12; H05K 5/00
[52] U.S. Cl. .................... 257/712; 257/713; 257/704; 257/706; 257/710; 257/717; 257/722; 361/688; 361/690; 361/697; 361/704; 361/709; 361/711; 361/713; 361/714
[58] Field of Search .................. 357/81, 84, 75, 357/74, 72, 80, 81; 257/712, 713, 717, 718, 720, 722, 705, 704, 706, 710, 796; 361/688, 690, 697, 704, 709, 711, 712, 713, 714

[56] References Cited

U.S. PATENT DOCUMENTS

| | | | |
|---|---|---|---|
| 2,881,370 | 4/1959 | Colson | 357/81 |
| 4,561,011 | 12/1985 | Kohara et al. | 257/722 |
| 4,612,601 | 9/1986 | Watari | 357/81 |
| 4,620,215 | 10/1986 | Lee | 257/712 |
| 4,770,242 | 9/1988 | Daikoku et al. | 257/720 |
| 4,914,551 | 4/1990 | Anschel et al. | 257/722 |
| 4,926,242 | 5/1990 | Itoh et al. | 257/720 |
| 4,964,458 | 10/1990 | Flint et al. | 257/712 |
| 4,965,660 | 10/1990 | Ogihara et al. | 357/81 |
| 5,003,429 | 3/1991 | Baker et al. | 257/722 |
| 5,055,914 | 10/1991 | Shimizu et al. | 257/720 |

FOREIGN PATENT DOCUMENTS

| | | |
|---|---|---|
| 0302641 | 2/1989 | European Pat. Off. |
| 2555812 | 5/1985 | France |
| 60-143653 | 7/1985 | Japan |
| 63-100758 | of 1988 | Japan |
| 3014261 | 3/1991 | Japan ........... 257/712 |

OTHER PUBLICATIONS

IBM Technical Disclosure Bulletin vol., 21, No. 6, Nov. 1978 E. G. Loeffel et al.: "Heat transfer apparatus for semiconductor chip".
IBM Technical Disclosure Bulletin vol. 21, No. 7, Dec. 1978 S. Hu et al.: "Reducing chip fracture tendency by cushioning".
"Microelectronics Packaging Handbook" Rao R. Tummala and Eugene J. Rymaszewski, 1988, pp. 49–53, 209–223.
IBM Technical Disclosure Bulletin, vol. 27, No. 7A, Dec. 1984 J. L. Horvath: "Cooling Assembly for Solder Bonded Semiconductor Devices".
IBM Technical Disclosure Bulletin vol. 24, No. 1A, Jun. 1981, W. A. Campo et al.: "Heat Spreader With Thermal

(List continued on next page.)

*Primary Examiner*—Sara W. Crane
*Assistant Examiner*—Carl Whitehead, Jr.

[57] ABSTRACT

A package for one or a plurality of semiconductor elements comprises a package substrate, at least one semiconductor element mounted on the package substrate having an active layer in a surface which faces away from the package substrate, a thin pliable electrically insulating resin layer applied to the surface of each semiconductor element, a metal cap which cooperates with the package substrate to hermetically enclose the space containing one or more semiconductor elements, and a heat diffusing plate of high thermal conductivity provided between the electrically insulating resin layer of each semiconductor element and the metal cap. A part of heat generated in the active layer is conducted through the heat diffusing plate to the metal cap and is released there, thereby shortening the heat path and reducing the heat-releasing surface of the package substrate.

24 Claims, 5 Drawing Sheets

OTHER PUBLICATIONS

Grease".
IBM Technical Disclosure Bulletin vol. 30, No. 2 Jul. 1987 "Accessible Chip Module".
IBM Technical Disclosure Bulletin vol., 19, No. 7 Dec. 1976 J. T. Gibney et al.: "Attachment of protective caps".

IBM Technical Disclosure Bulletin vol. 25, No. 11A, Apr. 1983, R. H. Lancombe et al.: "Flexible heat–conductive sheet material for semiconductor packages".

PACKAGE FOR SEMICONDUCTOR ELEMENTS HAVING THERMAL DISSIPATION MEANS

This is a continuation of application Ser. No. 795,875, filed Nov. 20, 1991 now abandoned.

BACKGROUND OF THE INVENTION

1. Field of the Invention

The present invention relates to a package for a semiconductor element or semiconductor elements capable of efficiently releasing heat generated within the element.

2. Description of the Prior Art

Lately, in response to the tendency toward high density circuitries, high power for high speed operation and large chips, there is a growing need for circuit elements with improved heat release. In order to meet this requirement, it has been necessary to lower thermal resistance $R_{th(j-a)}$ of a semiconductor package to 5° C./W and preferably 2° C./W. Opposed to this, is the drive towards miniaturizing devices as well as increasing pin number. It has consequently been necessary to improve the design of packages for mounting semiconductor elements.

Figure 1:
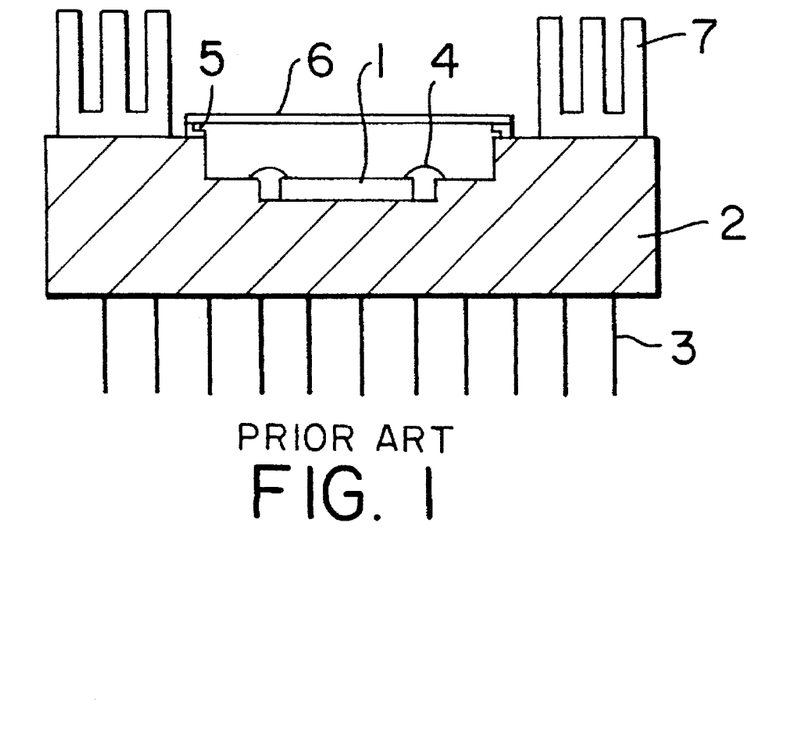
FIG. 1 is a cross-sectional view of a conventional semiconductor package.

FIG. 1 is a cross section of a conventional semiconductor package of high heat dissipation, given in Japanese Patent Laid-open No. 100758/1988.

A semiconductor element 1 formed in a multilayer interconnection structure is mounted through electrical and mechanical connections on a package substrate 2, and hermetically sealed with the aid of a metal cap 6 of kovar by seam-welding the metal cap to a seal ring 5 interposed between the substrate 2 and the metal cap 6. The package substrate 2 is made of aluminum nitride and has a plurality of input/output pins 3 on the back surface. In this example, a thermal resistance as low as 3° C./W (using a heat sink 7 forcedly air-cooled at 4 m/s) was attained.

In the package structure above, since the thermal resistance of the empty space between the surface of the semiconductor and the metal cap is very high, a thermal energy generated in the semiconductor element conducts mainly by way of the package substrate 2 to heat sink 7 to be dissipated there. One problem encountered with this structure is that the path of thermal conduction between the semiconductor element 1 and the heat sink 7 is long, causing high thermal resistance of the package.

Further, as described above, since the heat energy created in the semiconductor element is not released through the metal cap, the surface of the package which is in contact with the heat sink for dissipating the heat energy should be limited only to that of the package substrate. Consequently, in order to bring enough surface of the package substrate into contact with the heat sink to attain the desired heat resistance of the package, a large heat-releasing surface area of the package substrate will be necessary, which leads to difficulty in miniaturizing the package.

SUMMARY OF THE INVENTION

An object of the present invention is to provide a package for a semiconductor or semiconductors having a structure that shortens the path of heat conduction between the active layer of the semiconductor element (a heat source) and the heat sink and enables the efficient exchange of heat with the heat sink not only through the heat-releasing surface of the package substrate but also through other surfaces of the package, thereby solving the problems described above.

In order to attain the object above, a first package for a semiconductor element or semiconductor elements comprises a package substrate, one or more semiconductor elements mounted on the package substrate, each having an active layer in a surface which is directed away from the package substrate, a thin pliable electrically insulating resin layer applied to the surface of each of the one or more semiconductor elements, a metal cap which cooperates with the package substrate to hermetically enclose the space containing all of the one or more semiconductor elements, and one or more heat diffusing plates of a high thermal conductivity, each being provided between the metal cap and the thin pliable electrically insulating resin layer.

The heat diffusing plate conducts to the metal cap heat which is created in the semiconductor element and transmitted through the thin pliable electrically insulating resin layer from the active layer of the semiconductor element. Accordingly, by bringing the metal cap into contact with the heat sink it becomes possible to shorten the path of heat conduction between the semiconductor element and the heat sink, and to have the metal cap as well as the surface of the package substrate serve for heat exchange between the package and the heat sink, thereby enabling heat to be released through the cap, and consequently, allowing the heat-releasing area of the package substrate to be reduced in area, thereby enabling further miniaturization of the package.

Typically, the semiconductor element is mechanically fixed onto a package substrate formed of ceramic or organic material, and electrical connection of the semiconductor element to the package substrate is effected by the wire bonding method or the TAB (Tape Automated Bonding) method. With this step, the semi conductor element is mounted with its active layer surface directed toward the metal cap and its reverse surface bonded to the package surface. Hereafter, the active layer surface is referred to as the surface of the semiconductor element.

The package is preferably designed in such a manner that the heat diffusing plate is pressed against the semiconductor element through the electrically insulating resin layer by means of the elastic force of the metal cap, thereby ensuring a short and wide path of thermal conduction through surface contact between the semiconductor element and the electrically insulating resin layer, between the electrically insulating resin layer and the heat diffusing plate, and between the heat diffusing plate and the metal cap in order to promote heat dissipation of the package.

A heat diffusing plate of high thermal conductivity is preferably made from at least one metal selected from the group consisting of copper, silver, gold, aluminum, tungsten, molybdenum, nickel, and indium, or at least one electrically insulating material selected from the group consisting of diamond, boron nitride, silicon carbide, beryllium oxide, aluminum nitride and magnesium oxide, because the thermal conductivity of each of these materials at room temperature is as high as 50 W/m or more. The pliable electrically insulating resin layer is preferably formed from at least one rubber- or gel-like organic material selected from the group consisting of silicon resin, epoxy resin, or polyimide resin. Further, the electrically insulating resin layer preferably contains, as a filler, powder of at least one electrically insulating material of high thermal conductivity listed above in order to reduce the thermal resistance of the electrically insulating resin layer. Since the pliable electrically insulating resin layer effectively fills the gap between the surface of the semiconductor element and the heat diffusing plate, it serves to efficiently transmit heat energy from the semiconductor element to the metal cap. In addition, since the resin layer is pliable and electrically insulating, it electrically, mechanically and chemically protects the active layer of the semiconductor element from the ambience. In other words, the resin layer is capable of both relieving a stress generated in the active layer pressed by the heat diffusing plate and preventing electrical short circuits in the semiconductor element, and in addition, the resin layer passivates the surface of the active layer. While it is preferable to make the electrically insulating resin layer as thin as possible in order to reduce thermal resistance, any thickness of 10–300 µm is possible. The layer is preferably formed by first supplying a rubber- or gel-like material onto the surface of the semiconductor element and then forcing the material against the surface by means of the elastic force of the metal cap.

The package is hermetically sealed with the metal cap, typically by means of the seam-welding, or joining with an adhesive or solder. The metal cap is preferably made from cheap metal such as kovar, 42 alloy, copper or iron.

Finally, it is preferable to employ a heat sink for air cooling or a metal jacket for water cooling in order to promote a heat dissipation.

This method enables the production of a small package for mounting large chips with multiple pins at low thermal resistance as required in the field of semiconductors. Such a package meets the requirement for short wiring, high-speed operation and high-density circuitries.

A second package for a semiconductor element or semiconductor elements comprises a package substrate, one or more semiconductor elements mounted on the package substrate, each having an active layer in a surface which is directed away from the package substrate, a thin pliable electrically insulating resin layer applied to the surface of each of the one or more semiconductor elements, and a cap of high thermal conductivity which cooperates with the package substrate to hermetically enclose the space containing all of the one or more semiconductor elements and which contacts each thin pliable electrically insulating resin layer.

A part of heat energy created in the active layer of each semiconductor element is transmitted from the surface of the semiconductor element to the cap of high thermal conductivity through the thin pliable electrically insulating resin layer, and dissipated through a heat sink joined to the outside of the cap, thereby enabling an appreciable reduction in thermal resistance.

The semiconductor element is mechanically fixed onto the package substrate of ceramic or organic material, and electrical connection of the semiconductor element to the package substrate is then effected by the wire bonding method or the TAB (Tape Automated Bonding) method. With this step, the semiconductor element is mounted so that the active layer surface is directed towards the cap of high thermal conductivity and the reverse surface of the semiconductor element is bonded to the package surface. Next, the package substrate is hermetically sealed with the cap by means of seam-welding, or joining with an adhesive or solder.

The cap of high thermal conductivity provides a short and wide path of thermal conduction through surface contact with the surface of the semiconductor element via the thin pliable electrically insulating resin layer. The cap of high thermal conductivity is preferably made of at least one metal selected from the group consisting of copper, silver, gold, aluminum, tungsten, molybdenum, and nickel, or at least one electrically insulating material selected from the group consisting of diamond, boron nitride, silicon carbide, beryllium oxide, aluminum nitride and magnesium oxide, because the thermal conductivity of each of these material at room temperature is as high as 50 W/(m·K) or more.

The pliable electrically insulating resin layer is preferably formed of at least one rubber- or gel-like organic material selected from the group consisting of silicon resin, epoxy resin, or polyimide resin. Further, the electrically insulating resin layer preferably contains, as a filler, powder of at least one electrically insulating material of high thermal conductivity listed above in order to reduce the thermal resistance of the electrically insulating resin layer. Since the pliable electrically insulating resin layer effectively fills the gap between the surface of the semiconductor element and the heat diffusing plate, it serves to efficiently transmit heat from the semiconductor element to the metal cap. In addition, since the resin layer is soft and electrically insulating, it electrically, mechanically and chemically protects the active layer of the semiconductor element from the ambience. In other words, the resin layer is capable of both relieving the stress generated in the active layer due to pressure from the heat diffusing plate and preventing electrical short circuits in the semiconductor element. In addition, it passivates the surface of the active layer. While it is preferable to make the electrically insulating resin layer as thin as possible in order to reduce thermal resistance, any thickness within the range of 10–300 µm is possible. The layer is preferably formed by first supplying a rubber- or gel-like material onto the surface of the semiconductor element and then forcing the material against the surface.

Finally, it is preferable to employ a heat sink for air cooling or a metal jacket for water cooling in order to promote heat dissipation.

This method enables the production of a small package for mounting large chips with multiple pins at low thermal resistance as required in the field of semiconductors. This package meets requirements for short wiring, high-speed operation and high-density circuitries.

DETAILED DESCRIPTION OF THE PREFERRED EMBODIMENTS

Corresponding components are denoted by the same reference numerals for all of the figures.

Figure 2:
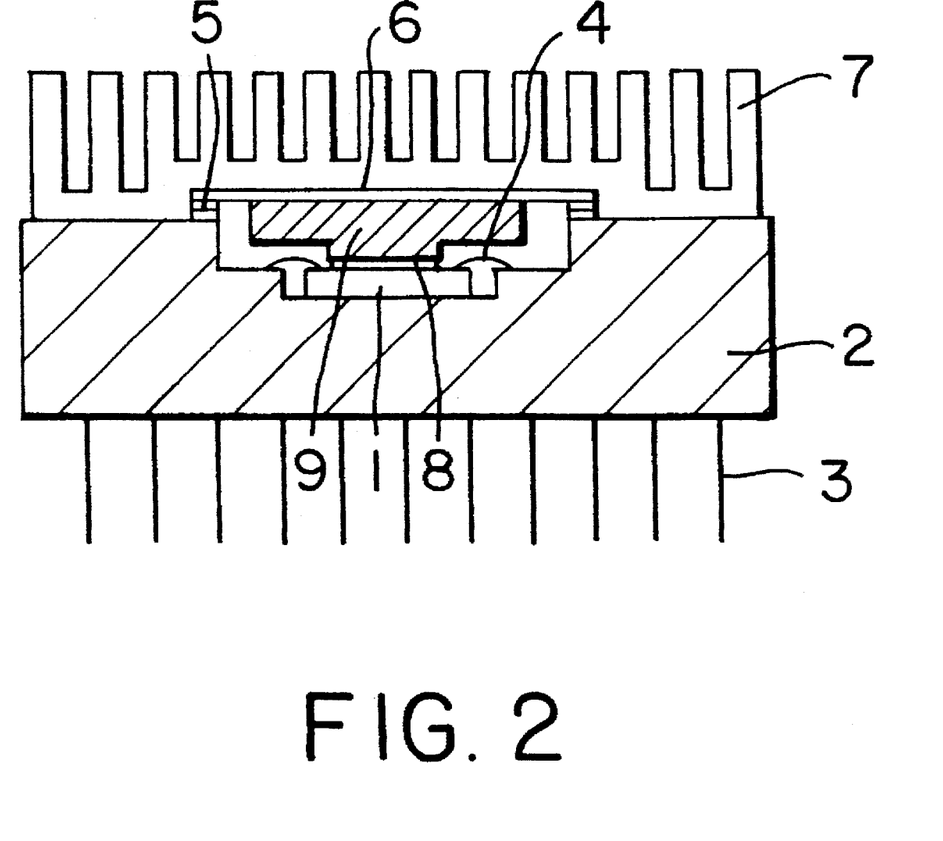
FIG. 2 is a cross-sectional view of a package for a single semiconductor chip according to a first embodiment of the present invention.

FIG. 2 shows a package for housing a single semiconductor chip according to a first embodiment of the present invention.

In FIG. 2, a semiconductor chip 1 is securely mounted to a package substrate 2 having input/output pins 3. The package substrate 2 is made of aluminum nitride. The semiconductor chip 1 and the package substrate 2 are electrically interconnected through wire bonding 4. The surface of the semiconductor chip on the side of the active layer is directed to the metal cap 6 and the surface of the semiconductor chip on the reverse side is bonded to the surface of the package substrate 2 and serves as the conventional path of heat conduction. Hereafter, the surface of the semiconductor chip on the side of the active layer is referred to as the surface of the chip. A heat diffusing plate 9 of high thermal conductivity which is made of aluminum nitride and is 1.0 mm thick, is brought into surface contact with the surface of chip 1 through a thin pliable electrically insulating resin layer 8, the resin layer 8 being of gel-like silicon resin and 50 μm thick.

In order to ensure the surface contact necessary to reduce thermal resistance at the contacting surface, the surface of chip 1 is pressed by the elastic force of metal cap 6. To effect this pressure, metal cap 6 is made from a nickel-coated kovar plate of elastically deformable thickness, 0.15 mm thick, and seam-welded to a seal ring 5. In the illustrated embodiment, metal cap 6 and diffusing plate 9 of aluminum nitride are brazed together with copper-silver solder (not shown in the figure) beforehand.

Heat created in semiconductor chip 1 is conducted from the surface of the chip to the aluminum nitride heat diffusing plate 9 of high thermal conductivity through the thin pliable electrically insulating layer 8 of silicon resin and further to metal cap 6 as well as is conducted by way of package substrate 2. The heat transmitted to metal cap 6 is dissipated through heat sink 7 coupled with the metal cap 6. In this way, a heat resistance $R_{th(j-a)}$ of 2° C./w (under forced air cooling at 4 m/s through a cooling fin) was attained.

Figure 3:
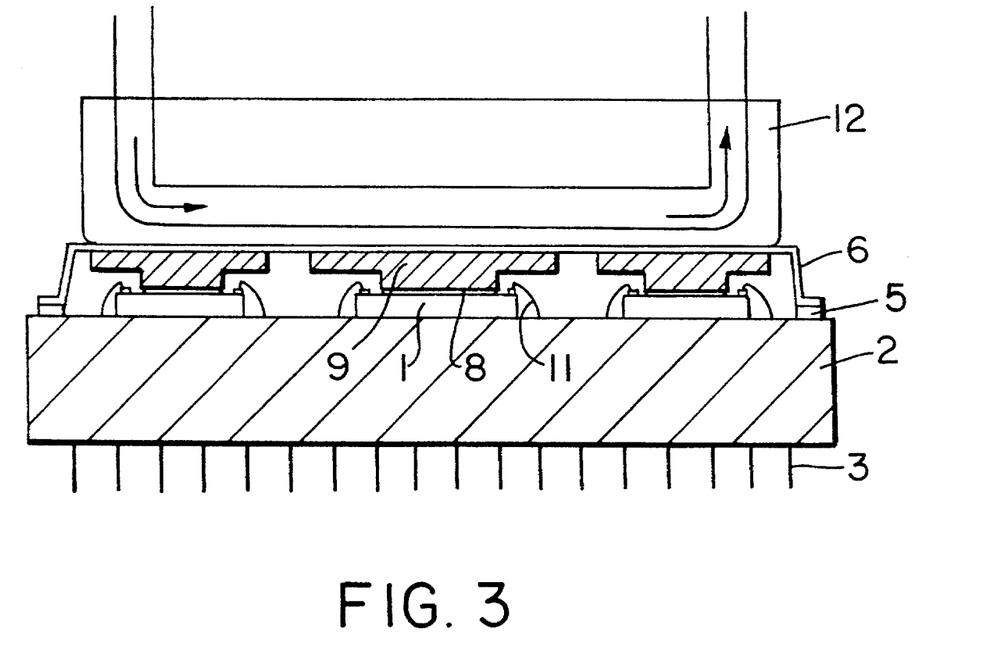
FIG. 3 is a cross-sectional view of a package for multiple semiconductor chips according to a second embodiment of the present invention.

FIG. 3 is a cross-sectional view of the second embodiment according to the invention.

As shown in FIG. 3, a plurality of semiconductor chips 1 are securely mounted on a large package substrate 2 of alumina and electrically connected to the package substrate through TAB 11. An aluminum nitride heat diffusing plates 9 of high thermal conductivity, each having a thickness of 0.6 mm, are in surface contact with the active layers of the respective semiconductor chips 1 through respective thin pliable electrically insulating layers 8 of silicone rubber, each 100 μm thick. A large metal cap 6 of copper is disposed on the heat diffusing plates 9 and, the peripheral edge resiliently deformed toward the package substrate 2 is seam-welded to a seal ring 5 on the package substrate 2. In the illustrated embodiment, metal cap 6 is constructed as a module provided with a water-cooled jacket 12 bonded to the outer surface of the metal cap 6.

A small package for a single semiconductor chip according to a third embodiment of the present invention will be described below with reference to FIG. 4.

Figure 4:
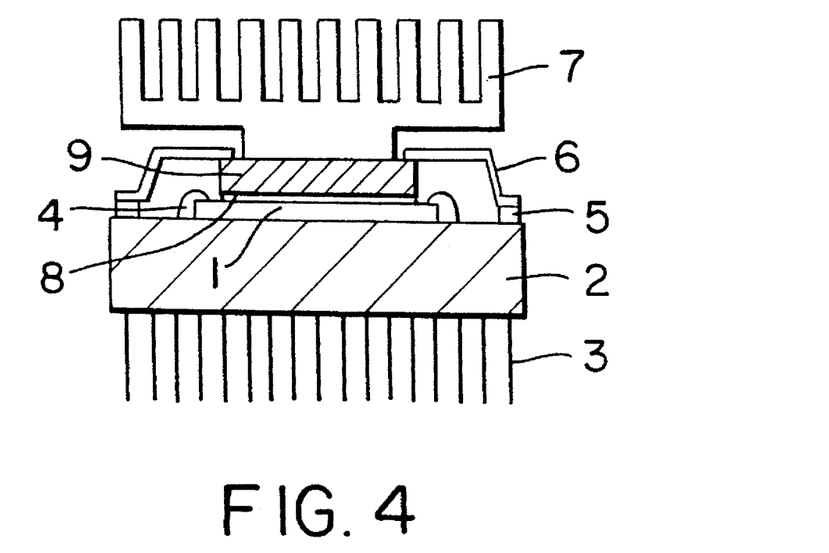
FIG. 4 is a cross-sectional view of a small multipin package for a single semiconductor chip according to a third embodiment of the present invention.

In FIG. 4, a semiconductor chip 1 is securely mounted on a package substrate 2 of alumina. The semiconductor chip 1 and the package substrate 2 are electrically interconnected through wire bonding 4. The active layer of the semiconductor chip 1 is in surface contact with an aluminum nitride heat diffusing plate 9 of high thermal conductivity, 0.5 mm thick, through a thin pliable electrically insulating layer 8 of epoxy resin 30 μm thick. A heat sink 7 is directly joined to the surface of the heat diffusing plate 9 directed away from the electrically insulating layer 8. A hollow metal cap 6 of kovar has inner peripheral edges integrally joined to the periphery of heat diffusing plate 9 and an outer peripheral edge seam-welded to a seal ring 5 disposed on package substrate 2, thereby hermetically sealing semiconductor chip 1. In this way, thermal resistance as low as 3° C./W was attained under forced air cooling at 3 m/s.

Figure 5:
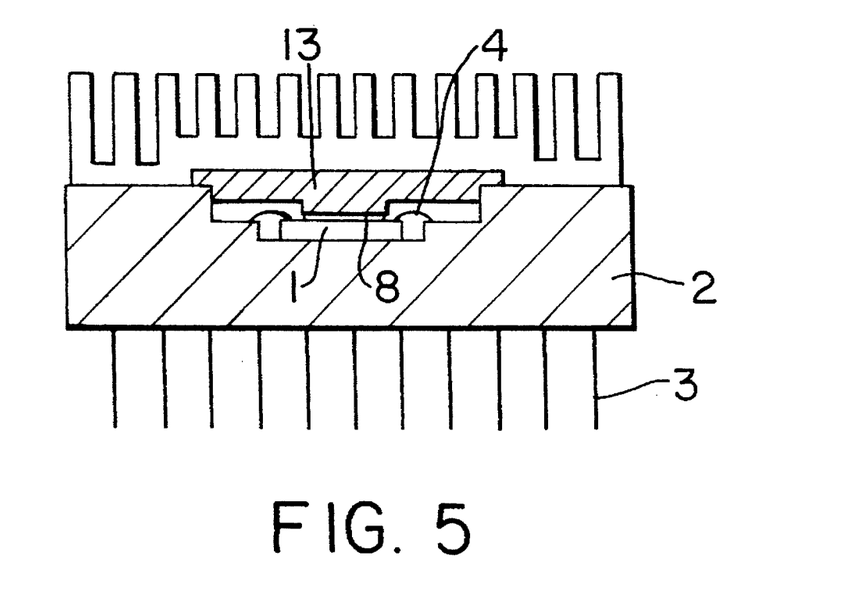
FIG. 5 is a cross-sectional view of a package for a single semiconductor chip according to a fourth embodiment of the present invention.

FIG. 5 illustrates a package for a single semiconductor chip according to a fourth embodiment of the present invention.

In FIG. 5, a semiconductor chip 1 is securely mounted on a package substrate 2 of aluminum nitride. Semiconductor chip 1 and package substrate 2 are electrically interconnected through wire bondings 4. The surface of chip 1 (as defined above) is directed toward a cap 13 of high thermal conductivity, and the back surface of the semiconductor chip 1 is bonded to package substrate 2 to provide the conventional path of thermal conduction. In the illustrated embodiment, aluminum nitride cap 13 of high thermal conductivity, 1.0 mm thick, is in surface contact with the surface of the chip through a thin pliable electrically insulating layer 8 of silicon resin, 50 μm thick. The periphery of the aluminum nitride cap 13 is metalized with gold beforehand, and the periphery and package substrate 2 are joined together to form a hermetic seal (not shown in the figure) with 90 Pb/10 Sn solder. A heat sink 7 is joined to the surface areas of both the cap 13 and the package substrate 2.

Heat generated in the semiconductor chip 1 is conducted from the surface of the chip 1 to an aluminum nitride cap 13 of high thermal conductivity through a thin pliable electrically insulating layer 8 of silicon resin, and is conducted by way of package substrate 2 as well. Heat transmitted to the cap 13 is released through heat sink 7 joined to the outside of the cap 13. In this way, a thermal resistance $R_{th(j-a)}$ of 2° C./W was attained (under forced air cooling at 4 m/s through a cooling fin).

Figure 6:
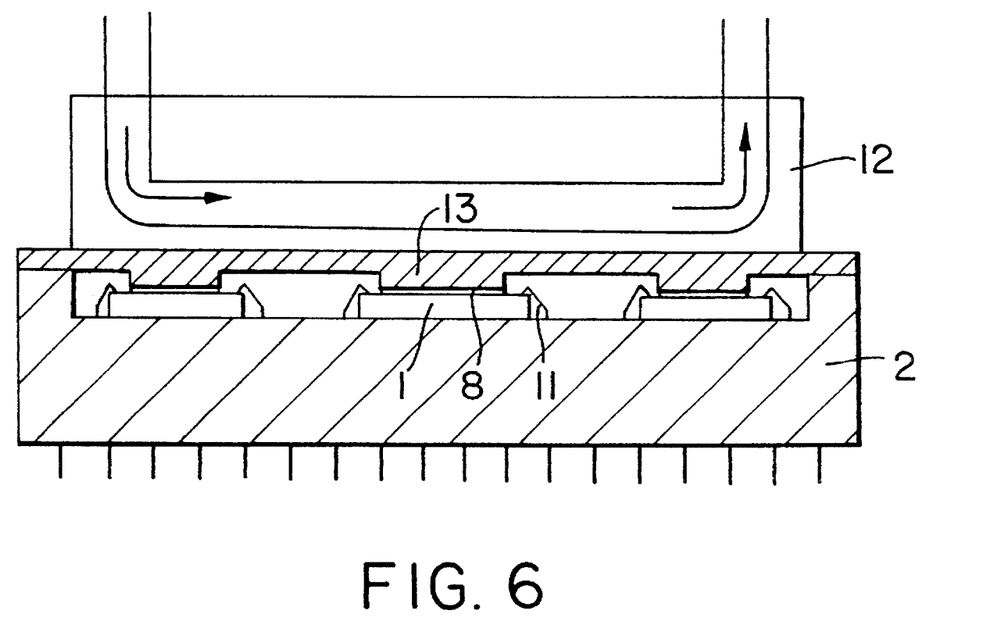
FIG. 6 is a cross-sectional view of a package for multiple semiconductor chips according to a fifth embodiment of the present invention.

FIG. 6 shows a package for housing multiple semiconductor chips according to a fifth embodiment of the present invention.

As shown in FIG. 6, a plurality of semiconductor chips 1 are securely mounted on a large package substrate 2 of alumina and electrically connected to the substrate through TAB 11. The surface of the chip is coated with thin pliable electrically insulating layer 8 of 100 μm thick silicon rubber, and is brought into surface contact with a large aluminum nitride cap 13 of high thermal conductivity, 1.5 mm thick, through the layer 8 of silicon rubber, and, with this, the periphery of the cap 13 is sealed to package substrate 2 with an epoxy resin adhesive. The cap 13 according to the present embodiment has a module structure provided with a water cooled jacket bonded to the outside of the cap 13.

Figure 7:
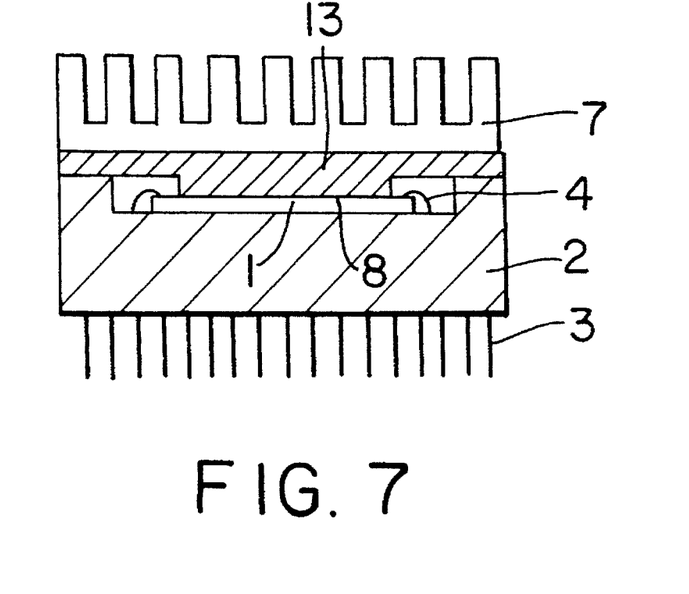
FIG. 7 is a cross-sectional view of a small multipin package for a single semiconductor chip according to a sixth embodiment of the present invention.

FIG. 7 shows a package for a single semiconductor chip according to a sixth embodiment of the present invention.

In FIG. 7, a semiconductor chip 1 is securely mounted on a package substrate 2 of alumina. The semiconductor chip 1 and the package substrate 2 are electrically interconnected through wire bonding 4. The semiconductor chip 1 on the package substrate 2 is hermetically sealed with a cap 13 of high thermal conductivity, the periphery of the cap 13 being bonded to the package substrate 2 with a silicon adhesive.

The cap 13 of high thermal conductivity is made of aluminum nitride and has a thickness of 0.5 mm. The cap 13 is in surface contact with the surface of the chip 1 through a thin pliable electrically insulating layer 8 of epoxy resin having a thickness of 30 μm. A heat sink 7 is joined to the outer surface of the cap 13. In this way, a thermal resistance $R_{th(j-a)}$ as low as 3° C./W was attained under a forced air cooling at 3 m/s.

Although certain preferred embodiments of the present invention have been shown and described in detail, it should be understood that various changes and modifications may be made therein without departing from the scope of the appended claims.

What is claimed is:

1. A package for at least one semiconductor element, comprising:

a package substrate, said at least one semiconductor element being mounted on the package substrate and having a first surface bonded to said substrate and a second surface facing away from the package substrate, said second surface having an active layer in which heat is generated in operation, a thin pliable electrically insulating resin layer applied to said active layer in contact therewith for electrically, mechanically and chemically protecting said active layer, a metal cap which cooperates with the package substrate to hermetically enclose a space containing said at least one semiconductor element, a heat sink mounted on said substrate at said metal cap for dissipating heat generated in said active layer, and at least one heat diffusing plate of high thermal conductivity, provided between the metal cap and the thin pliable electrically insulating resin layer, said thin pliable electrically insulating resin layer filling a gap between said active layer and said heat diffusing plate so that heat generated in said active layer is conducted through said thin pliable electrically insulating resin layer and said metal cap to said heat sink.

2. A package according to claim 1, wherein said heat diffusing plate is pressed against the active layer of said at least one semiconductor element through the electrically insulating resin layer by an elastic force of the metal cap.

3. A package according to claim 1, wherein the heat diffusing plate of high thermal conductivity is made of a material selected from one of at least one metal selected from the group consisting of copper, silver, gold, aluminum, tungsten, molybdenum, nickel, and indium, and at least one electrically insulating material selected from the group consisting of diamond, boron nitride, silicon carbide, beryllium oxide, aluminum nitride and magnesium oxide.

4. A package according to claim 1, wherein the electrically insulating resin layer is formed from one of rubber-like and gel-like organic material selected from the group consisting of silicone resin, epoxy resin, and polyimide resin.

5. A package according to claim 1, wherein the metal cap is made of at least one material selected from the group consisting of kovar, 42 alloy, copper and iron.

6. A package according to claim 4, wherein the electrically insulating resin layer contains, as a filler, powder of at least one electrically insulating material selected from the group consisting of diamond, boron nitride, silicon carbide, beryllium oxide, aluminum nitride and magnesium oxide.

7. A package according to claim 4, wherein the electrical insulating resin layer is 10 μm through 300 μm thick.

8. A package according to claim 4, wherein the electrically insulating resin layer is formed by pressing one of a rubber-like and gel-like material supplied in advance onto the second surface of the semiconductor element with pressure applied against the second surface of the semiconductor element by means of the elasticity of the metal cap.

9. A package for a semiconductor element or semiconductor elements, comprising:

a package substrate, at least one semiconductor element mounted on the package substrate and having an active layer in a surface thereof facing away from the package substrate, said active layer being a heat source in operation, a thin pliable electrically insulating resin layer provided on said surface of said at least one semiconductor element to mechanically, electrically and chemically protect said active layer, a cap of a high thermal conductivity which cooperates with the package substrate to enclose a space containing said at least one semiconductor element and which contacts said thin pliable electrically insulating resin layer, and a heat sink mounted at said cap so that heat generated in said active layer is conducted through said thin pliable electrically insulating resin layer and said cap to said heat sink.

10. A package according to claim 9, wherein the cap of high thermal conductivity is made of a material selected from one of at least one metal selected from the group consisting of copper, silver, gold, aluminum, tungsten, molybdenum, and nickel, and at least one electrically insulating material selected from the group consisting of diamond, boron nitride, silicon carbide, beryllium oxide, aluminum nitride and magnesium oxide.

11. A package according to claim 9, wherein the electrically insulating resin layer is made of one rubber-like and gel-like organic material selected from the group consisting of silicon resin, epoxy resin, and polyimide resin.

12. A package according to claim 11, wherein the electrically insulating resin layer contains, as a filler, powder of at least one electrically insulating material selected from the group consisting of diamond, boron nitride, silicon carbide, beryllium oxide, aluminum nitride and magnesium oxide.

13. A package according to claim 11, wherein the electrical insulating resin layer is 10 μm through 300 μm thick.

14. A package according to claim 9, wherein the electrically insulating resin layer is formed by pressing one of a rubber-like and gel-like material supplied in advance onto said active layer of the semiconductor element with pressure applied against said surface of the semiconductor element.

15. A package for semiconductor elements, comprising:

a package substrate, a plurality of semiconductor elements mounted on the package substrate, each having an active layer in a surface thereof facing away from the package substrate, said active layer being a source of heat in operation, and means to release said heat and including:

a thin pliable electrically insulating resin layer provided on the active layer of each of said semiconductor elements in contact with said active layer to electrically, mechanically, and chemically protect said active layer, a metal cap which cooperates with the package substrate to hermetically enclose a space containing said semiconductor elements, and a plurality of heat diffusing plates of high thermal conductivity, each being provided between the metal cap and the thin pliable electrically insulating resin layer so that heat generated in said active layer is conducted from said active layer through said thin pliable electrically insulating resin layer, a respective heat diffusing plate to said metal cap.

16. A package according to claim 15, wherein each heat diffusing plate is pressed against the active surface of each semiconductor element through the electrically insulating resin layer by an elastic force of the metal cap.

17. A package according to claim 15, wherein the heat diffusing plates of high thermal conductivity are made of a material selected from one of at least one metal selected from the group consisting of copper, silver, gold, aluminum, tungsten, molybdenum, nickel and indium, and at least one electrically insulating material selected from the group consisting of diamond, boron nitride, silicon carbide, beryllium oxide, aluminum nitride and magnesium oxide.

18. A package according to claim 15, wherein the electrically insulating resin layer is formed from one of rubber-like and gel-like organic material selected from the group consisting of silicone resin, epoxy resin, and polyimide resin.

19. A package according to claim 15, wherein the metal cap is made of at least one material selected from the group consisting of kovar, 42 alloy, copper and iron.

20. A package according to claim 18, wherein the electrically insulating resin layer contains, as a filler, powder of at least one electrically insulating material selected from the group consisting of diamond, boron nitride, silicon carbide, beryllium oxide, aluminum nitride and magnesium oxide.

21. A package for semiconductor elements, comprising:

a package substrate, a plurality of semiconductor elements mounted on the package substrate, each having an active layer in a surface thereof facing away from the package substrate, said active layer being a heat source in operation, a thin pliable electrically insulating resin layer mounted on said surface of each of said semiconductor elements in contact therewith, a cap of a high thermal conductivity which cooperates with the package substrate to enclose a space containing said semiconductor elements and which contacts each thin pliable electrically insulating resin layer, and a heat sink mounted at said cap so that heat generated in said active layer is conducted through said thin pliable electrically insulating resin layer and said cap to said heat sink.

22. A package according to claim 21, wherein the cap of high thermal conductivity is made of a material selected from one of at least one metal selected from the group consisting of copper, silver, gold, aluminum, tungsten, molybdenum, and nickel, and at least one electrically insulating material selected from the group consisting of diamond, boron nitride, silicon carbide, beryllium oxide, aluminum nitride and magnesium oxide.

23. A package according to claim 21, wherein the electrically insulating resin layer is made of one of rubber-like and gel-like organic material selected from the group consisting of silicon resin, epoxy resin, and polyimide resin.

24. A package according to claim 23, wherein the electrically insulating resin layer contains, as a filler, powder of at least one electrically insulating material selected from the group consisting of diamond, boron nitride, silicon carbide, beryllium oxide, aluminum nitride and magnesium oxide.

* * * * *